United States Patent
Deppe et al.

(10) Patent No.: US 8,592,838 B1
(45) Date of Patent: Nov. 26, 2013

(54) LOW VOLTAGE DISPLAY OR INDICATOR SYSTEM EMPLOYING COMBINATIONS OF UP CONVERTERS AND SEMICONDUCTOR LIGHT SOURCES

(75) Inventors: Dennis Deppe, Oviedo, FL (US); Michael Bass, Indian River Shores, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 561 days.

(21) Appl. No.: 12/349,712

(22) Filed: Jan. 7, 2009

Related U.S. Application Data

(63) Continuation-in-part of application No. 12/124,234, filed on May 21, 2008, now Pat. No. 7,899,093, and a continuation-in-part of application No. 12/124,620, filed on May 21, 2008, now Pat. No. 7,804,640.

(60) Provisional application No. 61/019,687, filed on Jan. 8, 2008, provisional application No. 60/939,924, filed on May 24, 2007, provisional application No. 60/939,956, filed on May 24, 2007.

(51) Int. Cl.
    *H01L 27/14* (2006.01)
(52) U.S. Cl.
    USPC .............. 257/89; 257/E33.024; 257/E27.133; 257/E27.134; 257/E27.136
(58) Field of Classification Search
    None
    See application file for complete search history.

(56) References Cited

U.S. PATENT DOCUMENTS

| | | | | |
|---|---|---|---|---|
| 3,842,195 A | * | 10/1974 | Takahashi et al. | 358/501 |
| 4,628,204 A | * | 12/1986 | Maes | 250/343 |
| 5,089,860 A | | 2/1992 | Deppe et al. | |
| 5,184,114 A | | 2/1993 | Brown | |
| 5,359,345 A | * | 10/1994 | Hunter | 345/102 |
| 5,684,621 A | | 11/1997 | Downing | |
| 5,754,340 A | * | 5/1998 | Ushida et al. | 359/566 |
| 5,764,403 A | | 6/1998 | Downing | |
| 5,914,807 A | | 6/1999 | Downing | |
| 5,943,160 A | | 8/1999 | Downing | |
| 5,956,172 A | | 9/1999 | Downing | |
| 6,028,977 A | * | 2/2000 | Newsome | 385/147 |
| 6,208,791 B1 | | 3/2001 | Bischel et al. | |
| 6,215,462 B1 | | 4/2001 | Yamada et al. | |
| 6,327,074 B1 | * | 12/2001 | Bass et al. | 359/326 |
| 6,501,590 B2 | | 12/2002 | Bass et al. | |
| 6,654,161 B2 | | 11/2003 | Bass et al. | |
| 6,795,455 B2 | | 9/2004 | Scheps | |
| 6,844,387 B2 | | 1/2005 | Bass et al. | |

(Continued)

*Primary Examiner* — Fei Fei Yeung Lopez
(74) *Attorney, Agent, or Firm* — Brian S. Steinberger; Phyllis K. Wood; Law Offices of Brian S. Steinberger, P.A.

(57) ABSTRACT

Methods and systems for a combination of up converters and semiconductor light sources in low voltage display or indicator system that can be battery powered. The display or indicator system includes one or more spatial light modulators and one or more up converters in combination with one or more semiconductor light sources. The spatial light modulator can be a liquid crystal display or a micro electro mechanical system or other spatial light modulator and can use direct modulation of the semiconductor light sources to modulate the visible emission from the up converters. The spatial light modulator can be placed between the up converting light source and the viewer or behind the up converting light source depending on the type of spatial light modulator, or modulation may be applied directly to one or more semiconductor light sources or arrays of semiconductor light sources that excite the up converters.

24 Claims, 7 Drawing Sheets

(56) References Cited

U.S. PATENT DOCUMENTS

| | | |
|---|---|---|
| 6,897,999 B1 | 5/2005 | Bass et al. |
| 7,471,706 B2 | 12/2008 | Bass et al. |
| 2001/0001532 A1* | 5/2001 | Galbraith et al. ............. 320/132 |
| 2001/0016285 A1* | 8/2001 | Cho et al. ................... 429/231.3 |
| 2001/0032386 A1* | 10/2001 | Yamada et al. .............. 29/623.1 |
| 2002/0015218 A1* | 2/2002 | Bass et al. ..................... 359/326 |
| 2002/0057552 A1* | 5/2002 | Dinkin .......................... 361/683 |
| 2003/0006382 A1* | 1/2003 | Spath et al. ................. 250/495.1 |
| 2003/0063284 A1* | 4/2003 | McAndrew et al. .......... 356/437 |
| 2003/0117369 A1* | 6/2003 | Spitzer et al. ................. 345/156 |
| 2008/0158874 A1* | 7/2008 | Duncan et al. ................ 362/231 |

* cited by examiner

LOW VOLTAGE DISPLAY OR INDICATOR SYSTEM EMPLOYING COMBINATIONS OF UP CONVERTERS AND SEMICONDUCTOR LIGHT SOURCES

This application is a continuation-in-part of U.S. patent application Ser. No. 12/124,234 filed on May 21, 2008 and U.S. patent application Ser. No. 12/124,620 filed on May 21, 2008 which claim the benefit of priority to U.S. Provisional application Nos. 60/939,924 filed on May 24, 2007 and 60/939,956 filed on May 24, 2007, respectively, and also claims the benefit of priority to U.S. Provisional application No. 61/019,687 filed on Jan. 8, 2008 and was funded in part by subcontract through NSF Grant No. IIP-0637800, effective Jan. 1, 2007 through Dec. 31, 2007.

FIELD OF THE INVENTION

This invention relates to low voltage display and indicator systems and, in particular, to methods, systems, apparatus and devices for a combination of up converters and semiconductor light sources with spatial light modulators for displaying images in low voltage display and indicator systems.

BACKGROUND AND PRIOR ART

Two dimensional and three dimensional displays are well known to be made monochromatic displays. However, monochromatic does not offer the detail such as shown using red, green and blue colors. Displays using liquid crystals have been proposed of generating color displays. A problem with this type of prior art display is that they require arranging individual pixels in rows and corresponding columns, column 4, lines 36-39. Another problem is that the devices described can be expensive and complicated to manufacture, can have a narrow angular view ranges with low brightness.

Several patents have been proposed for panel displays using two-frequency up conversion fluorescence. For example, U.S. Pat. Nos. 5,684,621; 5,764,403; 5,914,807; 5,943,160; and 5,956,172 all issued to Downing. The Downing '403 patent appears to be the most relevant to the subject invention. Downing '403 is primarily concerned with embodiments where the use different layers for red, green and blue emitters briefly describes some mixing in mixing of only crystal type materials in a single display media. However, for the single display media, Downing '403 uses nanometer sized particles which would inherently be difficult to form, handle and disperse in a display medium.

U.S. Pat. No. 6,327,074 titled "Display media using emitting particles dispersed in a transparent host" issued to M. Bass and H. Jenssen on Dec. 4, 2001 discloses two and three dimensional color image displays. The displays include a display medium having a substantially uniform dispersion of red, green and blue visible light emitting particles sized between approximately 0.5 to approximately 50 microns therethrough. The particles can be dye doped polymethylmethacrylate(pmma) plastic, and the display medium can be pmma, acrylic plastic or glass. Other particles can be used such as rare earth doped crystals. The two dimensional display uses three laser sources each having different wavelengths that direct light beams to each of three different types of particle in the display medium. Light is absorbed by the particles which then become excited and emit visible fluorescence. Modulators, scanners and lens can be used to move and focus the laser beams to different pixels in order to form the two dimensional images having different visible colors.

U.S. Pat. No. 6,501,590 titled "Display medium using emitting particles dispersed in a transparent host" issued to M. Bass and H. Jenssen on Dec. 31, 2002 describes another two and three dimensional color image display device. The displays include a display medium having a substantially uniform dispersion of red, green and blue visible light emitting particles sized between approximately 0.5 to approximately 50 microns therethrough. The particles can be dye doped polymethylmethacrylate(pmma) plastic, and the display medium can be pmma, acrylic plastic or glass. Other particles can be used such as rare earth doped crystals. The two dimensional display uses three laser sources each having different wavelengths that direct light beams to each of three different types of particle in the display medium. Light is absorbed by the particles which then become excited and emit visible fluorescence. Modulators, scanners and lens can be used to move and focus the laser beams to different pixels in order to form the two dimensional images having different visible colors.

Two and three dimensional display based on up conversion of near infrared light to the visible are described in U.S. Pat. No. 6,654,161 titled "Dispersed crystallite up-conversion displays" issued to M. Bass, H. Jenssen and Alexandra Rapaport issued on Nov. 25, 2003. The display medium is a transparent polymer containing particles of crystals doped with $Yb^{3+}$ and other rare earth ions. The $Yb^{3+}$ ions absorb light from a commercially available diode laser emitting near 975 nm and transfer that energy to the other dopant ions. Using a fluoride crystal host, $NaYF_4$, co-doped with $Tm^{3+}$ ions we obtain blue light at .about.480 nm, with $Ho^{3+}$ or $Er^{3+}$ ions we obtain green light at .about.550 nm and with $Er^{3+}$ we obtain red light at .about.660 nm. The display medium is also used with a preferred component layout with experimentation test data, along with applications for full color, high brightness, high resolution, displays.

The doping of heavy metal luminophores in commercially available optical grade plastics, such as poly (methyl methacrylate) or polystyrene, generally results in the aggregation of the metal salt. This aggregation leads to excessive light scattering, weakening of the plastic's mechanical strength, and an inhomogenous composite that would be unsuitable for optical or display applications. U.S. Pat. No. 6,844,387 titled "Composites of inorganic luminophores stabilized in polymer hosts" issued to M. Bass and K. Belfield issued on Jan. 18, 2005 discloses a two and three dimensional display medium having a novel transparent polymer composite containing particles of crystals doped with $Yb^{3+}$ and other rare earth ions. The polymer composite creates homogeneously dispersed compositions without cracking or delamination of the film and can be used for various optical applications.

U.S. Pat. No. 6,897,999 titled "Optically Written Display" issued to Jason Eichenholz, M. Bass and Alexandra Rapaport issued on May 25, 2005 discloses another two, three dimensional color displays having uniform dispersion of red, green and blue visible light emitting micron particles. Pumping at approximately 976 nm can generate green and red colors having an approximately 4% limit efficiency. Modulators, scanners and lens can move and focus laser beams to different pixels forming two dimensional color images. Displays can be formed from near infrared source beams that are simultaneously split and modulated with micro electro mechanical systems, spatial light modulators, liquid crystal displays, digital micromirrors, digital light projectors, grating light valves, liquid crystal silicon devices, polysilicon LCDs, electron beam written SLMs, and electrically switchable bragg gratings. Pixels containing: Yb,Tm:YLF can emit blue light, Yb,Er(NYF) can emit green light, and Yb,Er:KYF and Yb,Ef: YF.sub.3 can emit red light.

U.S. Pat. No. 5,089,860 issued to D. G. Deppe and T. J. Rogers and titled "Quantum Well Device With Control of Spontaneous Photon Emission, and Method of Manufacturing Same," on 18 Feb., 1992 describes spontaneous photon emission intensity in a semiconductor quantum well that is strongly influenced by a highly reflecting interface, with the quantum well to interface spacing being less than the optical emission wavelength of the quantum well. An enhancement/inhibition ratio on the order of 10 is possible according to the present invention using a single reflector, and enhancement/inhibition ratios on the order of 1000 are possible when two reflectors are used in the quantum well light-emitting diode structures. In addition, according to the present invention, the gain, directionality, and efficiency of a vertical cavity surface-emitting laser can also be greatly improved. The patent includes a method of making the spontaneous photon emission intensity in a semiconductor quantum well.

A recent patent related to the subject matter of the present invention issued on Dec. 30, 2008 to the same assignee as the subject application and having a common inventor with the subject application is U.S. Pat. No. 7,471,706. The patent discloses a light emitting device that includes a substrate, at least one semiconductor light emitting device formed in or on the substrate, and up converting material disposed in or on the substrate. The up converting material is disposed in a path of light processed or emitted by the semiconductor device. The up converting material absorbs light emitted by the semiconductor device and emits up converted light in response. Integrated pixelated displays include a plurality of pixels formed on a surface of the substrate, with each pixel including up-conversion material based red light source, a blue light source a green light source, and a structure for selectively controlling emission from the red, blue and green lights sources for each of the pixels.

The prior art does not deal with the displays or display lighting using up converting materials with semiconductor light sources in combination with electronic devices that can be powered by less than 2 V and even less than 1.5 V. This is critical in battery powered devices. The prior art requires complex circuitry to boost the voltage from that provided by the battery to that required by the display or display lighting. This complexity adds significant cost and reduces efficiency which in battery powered devices translates to battery use time. The present invention greatly improves the efficiency of such electronic devices bringing down their cost and extending the use time of the batteries between recharging. The current invention may also lead to longer battery life as it enables devices that require fewer recharging cycles over the device's life.

SUMMARY OF THE INVENTION

A primary objective of the invention is to provide methods, systems, apparatus and devices a combination of up converters and semiconductor light sources in low voltage display systems that may be battery powered.

A secondary objective of the invention is to provide methods, systems and apparatus with benefits that reduce complexity, increase efficiency and reduce cost.

A third objective of the invention is to provide methods, systems and apparatus that improves the efficiency of such electronic devices bringing down their cost and extending the use time of the batteries between recharging. The current invention leads to longer battery life as it enables devices that require fewer recharging cycles over the device's life.

A fourth objective of the invention is to provide methods, systems and devices using a combination of up converters with GaAs based semiconductor light sources that makes possible displays and display lighting that is compatible with a variety of battery technologies, particularly lithium ion batteries.

A fifth objective of the invention is to provide methods, systems and devices using a combination of up converters with GaAs based semiconductor light sources for simpler, more efficient battery operated electronic devices including but not limited to head mounted displays, cellular phone displays, PDA displays, electronic cameras and video cameral displays, lap top computers and other flat panel displays.

A sixth objective of the invention is to provide methods, systems and devices for combinations of up converting materials with semiconductor light sources serving as the display or display lighting in low voltage and, possibly, battery powered electronic devices that increases the simplicity and efficiency of the devices, as a consequence batteries operate longer before recharging is required and, as a further consequence, will last longer overall.

In a preferred embodiment, the methods and systems provide low voltage display or indicator system having a plurality of pixels. Each pixel includes at least one up converter, at least one semiconductor light source coupled with the at least one up converter for emitting a light to excite the up converter to emit an up converted emission, at least one modulator for modulating the up converted emission and a structure for selectively controlling the emission from the at least one up converter for each pixel.

In an embodiment, the at least one up converter for each pixel includes an up converter having conversion material for red light emission, an up converter having conversion material for green light emission and an up converter having conversion material for blue light emission. The semiconductor light source can include an array of semiconductor light sources for exciting the up converters or can include a separate semiconductor light source for exciting each of the red, green and blue up converter to emit the red, green and blue emissions for each pixel. The semiconductor light source can be a GaAs based semiconductor light source.

The spatial light modulator can be located behind the semiconductor light source to modulate the semiconductor light source emission that excites the up converter or be located to receive and modulate the emission from the up conversion device. The spatial light modulator can be a liquid crystal display, a micro electro mechanical system or other spatial light modulator that are know to those skilled in the art.

The display or indicator system can include a battery for supplying a voltage to the display or indicator system and the battery can supply a voltage great than 4 volts or a voltage within a range of approximately 4 volts to approximately 1.5 volts. The battery can be a lithium ion battery, a nickel-cadmium battery or other battery.

The combination of up converters with GaAs based semiconductor light sources provide simpler, more efficient battery operated electronic devices including but not limited to cellular telephone displays, PDA displays, electronic camera and video camera displays, lap top computer and flat panel displays.

Another embodiment provides a system for displaying color images from a display medium. The system includes a semiconductor light emitting device for emitting a light, an up converting materials in a path of the light emitted by the semiconductor light emitting device, the up converting material absorbing the emitted light to excite the up conversion material to emit an up converted light in response and a spatial light modulator for modulating the up converted emission from the up converter. The spatial light modulator can directly modulate the semiconductor light emitting device that excites the up converter or be placed to receive and modulate the emission from the up conversion material. The spatial light modulator is selected from a group consisting of a liquid crystal display and a micro electro mechanical system (MEMS). The system can be used with a low voltage display or indicator having a pixilated display including a plurality of pixels. Each pixel includes an up conversion material for red, green and blue light emission and a structure for selectively controlling the emission from the red, green and blue up conversion material for each pixel.

Yet another embodiment provides a method of displaying color images from a display medium that includes the steps of controllably generating a light beam from a semiconductor light source, absorbing a portion of the light beam in an up converter to excite the up conversion material, modulating the visible emission from the up converter with a spatial light modulator and emitting visible color light from the up converter. The spatial light modulator can be placed behind the semiconductor light source to directly modulate the semiconductor light source or be placed to directly modulate the visible light emission from the up converter.

Further objects and advantages of this invention will be apparent from the following detailed description of preferred embodiments which are illustrated schematically in the accompanying drawings.

BRIEF DESCRIPTION OF THE FIGURES

FIG. 5a is a schematic of a diode array used in active matrix addressing according to the present invention FIG. 5b is an exploded view of one pixel of the diode array shown in FIG. 5a.

DESCRIPTION OF THE PREFERRED EMBODIMENTS

Figure 1A:
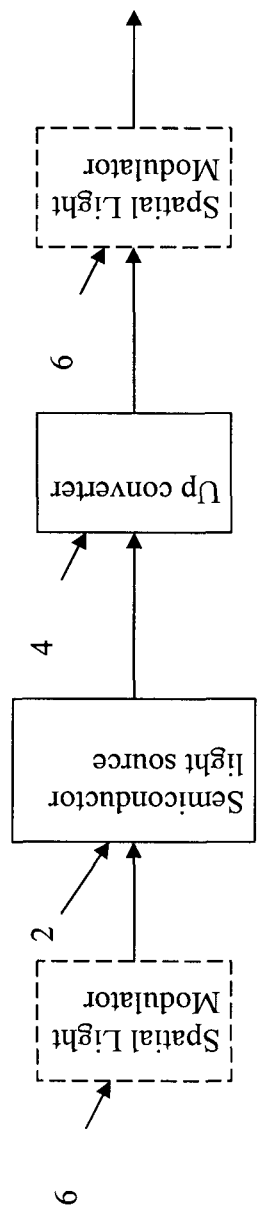
FIG. 1a is a block diagram showing an example of a monochrome configuration of a modulated up converter-semiconductor light source combination according to the present invention.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:
2 semiconductor lighl source
4 up converter
6 spatial light modulator
10 display system
20 semiconductor light source
22 red up converter
25 red spatial light modulator
30 semiconductor light source
32 green up converter
35 green spatial light modulator
40 semiconductor light source
44 blue up converter
45 blue spatial light modulator
100 RGB pixel
110 semiconductor light source
122 red up converter
124 green up converter
126 blue up converter
130 surface emitter
140 RGB mirror
200 UC/RCLED pixel array
220 RCLED
300 pixel
320 semiconductor light source
322 red up converter
324 green up converter
326 blue up converter
400 pixel
410 column electrodes
415 row electrodes
422 red up converter
424 green up converter
426 blue up converter
430 column isolations
435 row isolations The present invention provides methods, systems and apparatus for a combination of up converters and semiconductor light sources in low voltage display systems that may be battery powered. The primary benefits resulting from the present invention include low voltage display systems having reduced complexity, increased efficiency and reduced cost. According to a preferred embodiment of the present invention, the display or indicator system includes one or more spatial light modulators and one or more up converters in combination with one or more semiconductor light sources.

In a preferred embodiment shown in FIG. 1a, the methods and systems provide a monochrome low voltage display or indicator system including at least one an up converter 4, at least one semiconductor light source 2 coupled with the up converter 4 for emitting a light to excite the up converter to emit an up converted emission, and at least one modulator 6 for modulating the up converted emission. The spatial light modulator 6 can be located behind the semiconductor light source 2 to modulate the semiconductor light source emission that excites the up converter 4 or be located to receive and modulate the emission from the up converter 4.

Figure 1B:
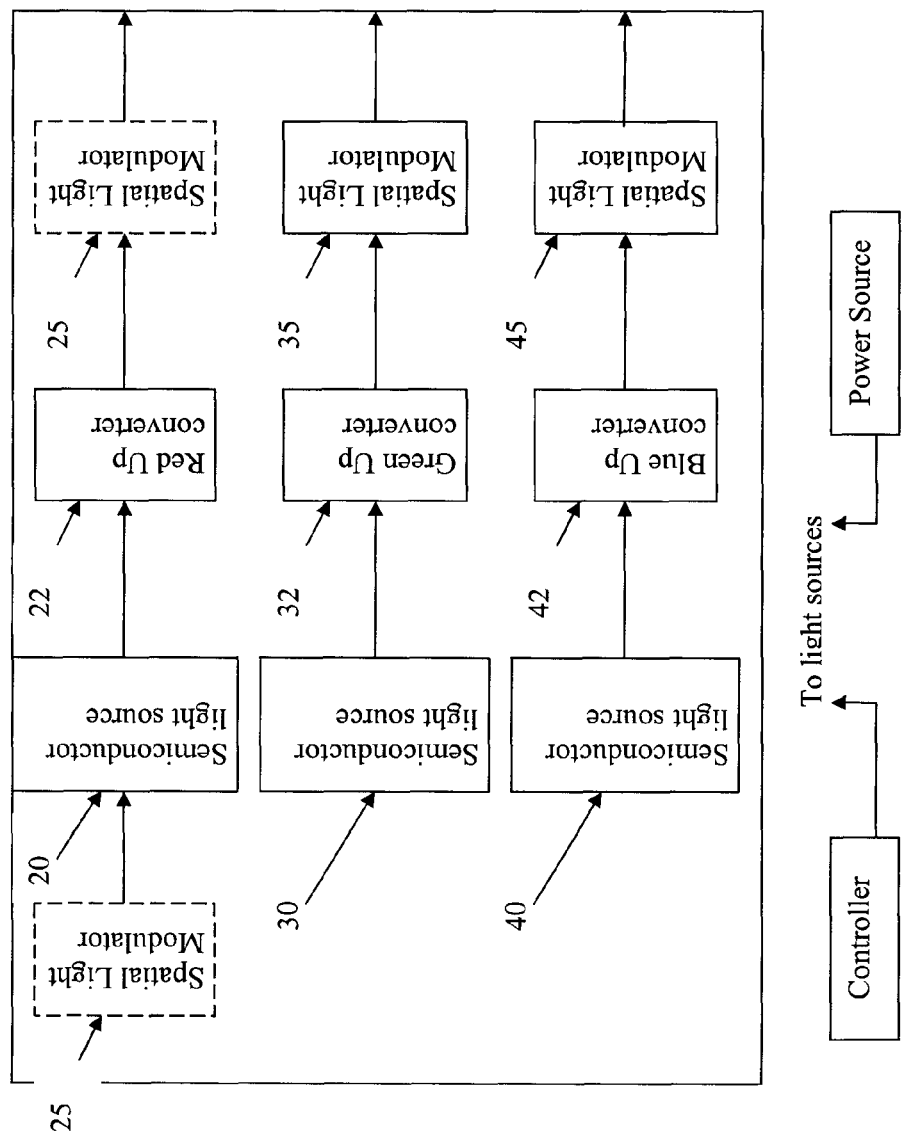
FIG. 1b shows an example of a configuration of components in the full color display using red, green and blue up converter-semiconductor light source displays according to the present invention.

FIG. 1b shows an example of a configuration including a red up converter 22, a green up converter 32 and a blue up converter 42 coupled with semiconductor light sources 20, 30 and 40, respectively, to produce an up converted red, green and blue light. Spatial light modulators 25, 35, 45 modulate the up converted light, and as shown for the red up converter 22, the spatial light modulator 25 can be placed before the semiconductor light source 20 or in the path of the up converted light. The semiconductor light source can include an array of semiconductor light sources for exciting the up converters or can include a separate semiconductor light source as shown in FIG. 1b for exciting each of the red, green and blue up converter to emit the red, green and blue emissions for each pixel. The semiconductor light source can be a GaAs based semiconductor light source. This combination of up converters, semiconductor light sources and spatial light modulators form a display system for a low voltage display such as a computer monitor, cellular phone displays, PDA displays, electronic cameras and video camera displays, lap top computers and other flat panel displays.

The spatial light modulator can be a liquid crystal display (LCD), a micro electro mechanical system (MEMS) or other spatial light modulator. Direct modulation of the semiconductor light sources to modulate the visible emission from the up converters is also available. The spatial light modulator can be placed between the up converting light source and the viewer or behind the up converting light source depending on the type of spatial light modulator, or modulation may be applied directly to one or more semiconductor light sources or arrays of semiconductor light sources that excite the up converters.

Figure 2:
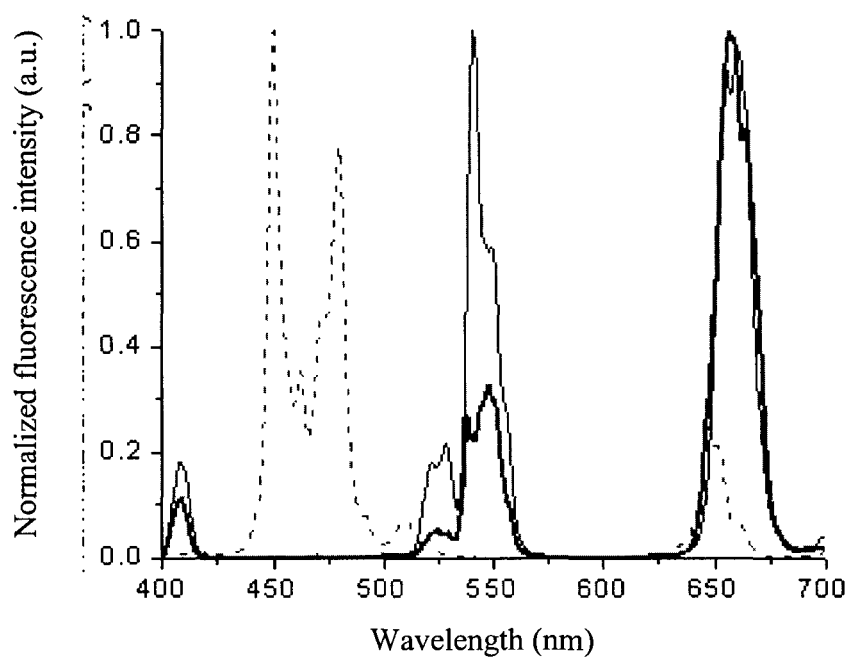
FIG. 2 shows the emission spectra of the green, red and blue emitters operating at maximum efficiency and each has been normalized to its highest peak.

FIG. 2 shows the emission spectra of the green, red and blue emitters operating at maximum efficiency and each has been normalized to its highest peak. While providing separate red, green, and blue emitters, the up-converters can also be combined to produce white light. In particular, the blue and red emitters are complementary colors since the red emitter also emits a small amount of green light. When these two are combined, a white light source is produced.

Figure 3:
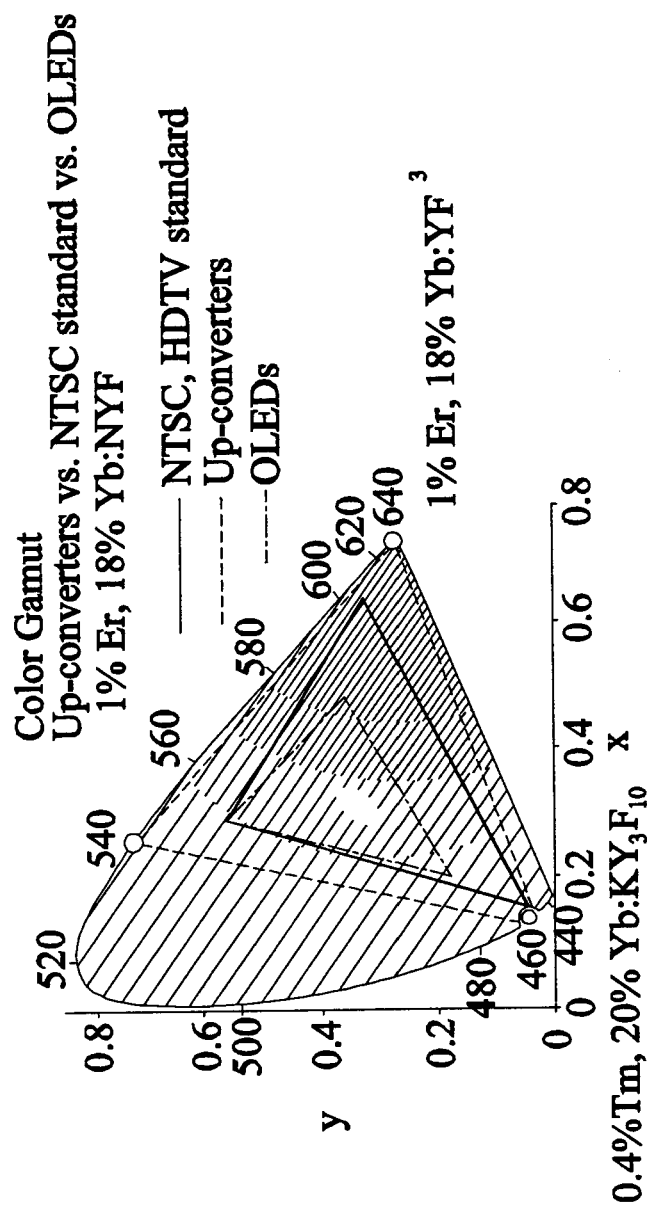
FIG. 3 shows color gamuts of solid-state up-converters plotted with NTSC/HDTV standard and OLED display from one of the leading manufacturers specializing in headset products (eMagin).

FIG. 3 shows the color gamuts of solid-state up-converters plotted with NTSC/HDTV standard and OLED display from one of the leading manufacturers specializing in headset products (eMagin). The up converters, based on rare earth doped fluorides, emit at the points on the diagram boundary and so are one of very few light sources that can reach or exceed the NTSC color standard. This establishes the UC-RCLED display's ability to fully reproduce the real life color spectrum as sensed by the human eye. The color spectrum is pure and is represented by the points indicated on the color diagram in FIG. 3 for the materials indicated.

As described in U.S. Pat. No. 7,471,706, issued on Dec. 30, 2008 to the same assignee as the subject application and having a common inventor with the subject application which is incorporated by reference. In this embodiment, the up converting material is in optical communication with light emanating from the semiconductor light emitting surface. For example, the up conversion material can be in a resonant cavity formed in the substrate spaced apart from the light emitting device. Arrays of semiconductor light sources with appropriate up converters according to the present invention can be used to fabricate high resolution displays having hundreds or many thousands of pixels. In some embodiments the semiconductor light sources are RCLEDs.

To form full color displays, pixels containing one red, one green and one blue emitting combination of up converting particles and semiconductor light sources are provided. Monochromatic displays, as shown in FIG. 1a, of any color are also possible by selecting any one of the primary (RGB) up converters or by combining them to achieve another desired color. White light can be generated by selecting appropriate combinations of two or three or more emitters.

Figure 4:
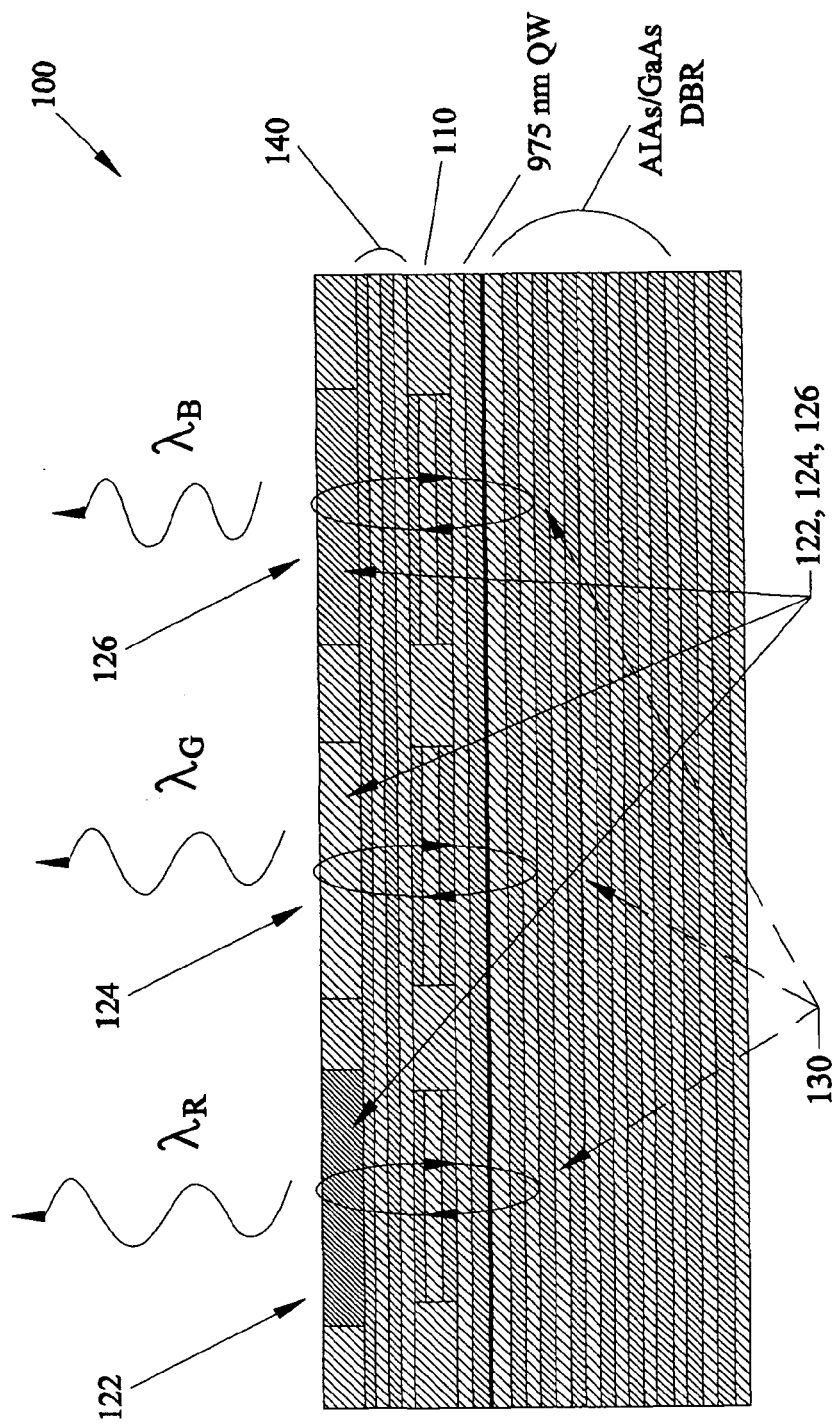
FIG. 4 is a schematic showing the excitation scheme of the up-converter resonant cavity light emitting diode red, green and blue pixel.

FIG. 4 is a schematic showing the excitation scheme of the up-converter/resonant cavity light emitting diodes (UC/RCLED) red, green and blue (RGB) pixel 100 as described in U.S. patent application Ser. No. 12/124,234 filed on May 21, 2008, by the same assignee as the subject application and a common inventor with the subject application which is incorporated by reference. The up-converters 122, 124 and 126 are excited by light emitted from the semiconductor light sources 110. In an embodiment a broadband RGB mirror 140 is used to increase the emission efficiency of the surface emitters. A second mirror could also be placed above the up-converters 122, 124 and 126 and separately tuned to the red, green, and blue emission peaks to further increase the efficiency and spectral purity, where cavity tuning is accomplished by the up-converter containing film thicknesses.

The up converting materials can be selected from materials which emit red, green, and blue visible light. For display applications the respective up converter material (red, green and blue emitting) are spatially separated from one another and are generally excited by their own light sources. Each display pixel thus generally has three associated semiconductor light emitting devices as shown in FIG. 1b, with one light emitting device coupled to the red up converting material, one light emitting device coupled to the green up converting material and one blue light emitting device coupled to the blue up converting material. When more than one emitter in a pixel is excited, a human observer will see a color other than red, green or blue, but rather a color that lies within the color gamut defined by the combination of wavelengths emitted. A pixel thus can generate any color by emitting the desired mixture of red green and/or blue so long as that color lies within the color gamut. Separate emitters can be independently accessed and made to emit independently using well known addressing techniques. Independent emission of the red, green, and blue light emitters can be used to fabricate a full color display.

Combinations of color emitters to generate white light sources, or single color sources are also possible. For such applications the emitters can be combined in layered or mixed combinations to be jointly excited by a single semiconductor light source. These combinations can be useful for illumination using the white light source, or for signaling or other applications using individual colors or combined colors of fixed spectral content.

As known in the art, the pixel emission can be controlled by addressing the semiconductor light source with its own electrodes, or with an array of electrodes to form matrix addressing. The matrix addressing can be active or passive. For example, using two-dimensional active matrix addressing, a row of semiconductor light emitters may be simultaneously gated by applying a given voltage, while additional voltage is applied to column electrodes. The column electrode voltages may contain display data in their specific voltage values, and this data can be transferred to the semiconductor light emitter, which in turn excites the up converting material. By choosing an electro-optical response of the semiconductor light source that is faster than the optical response of the up converting material, visible luminescence can be maintained in the up converting material after the semiconductor light source is turned off. In this manner display data can be individually sent to a large number of pixels using a much smaller number of electrodes. Passive matrix addressing can also be achieved using similar optical responses between the semiconductor light source and up converting materials.

Figures 5A, 5B:
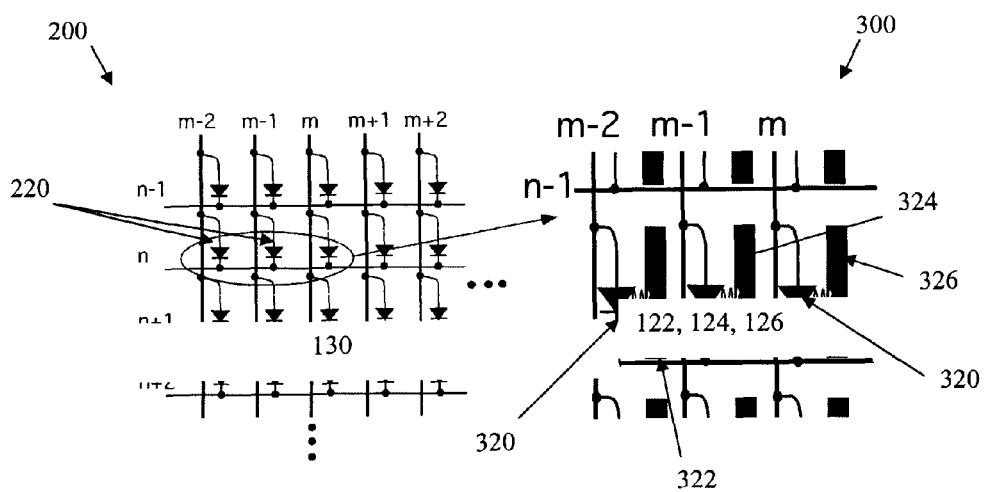

As described and shown in co-pending U.S. patent application Ser. No. 12/124,234, FIG. 5a shows an example of a design for active matrix addressing for the UC/RCLED display given a 2-D array of N×M pixels 200. FIG. 5b is an exploded view of one pixel 300 showing the red, green and blue up-converters 322, 324 and 326, respectively. Energy storage of each pixel color is carried out by the up-converter 322, 324 and 326 (the up-converters emission lifetimes are approximately 1 msec), while the semiconductor light source 220 provides for gate switching and data storage in the form of optical excitation in the up-converter.

Figure 6:
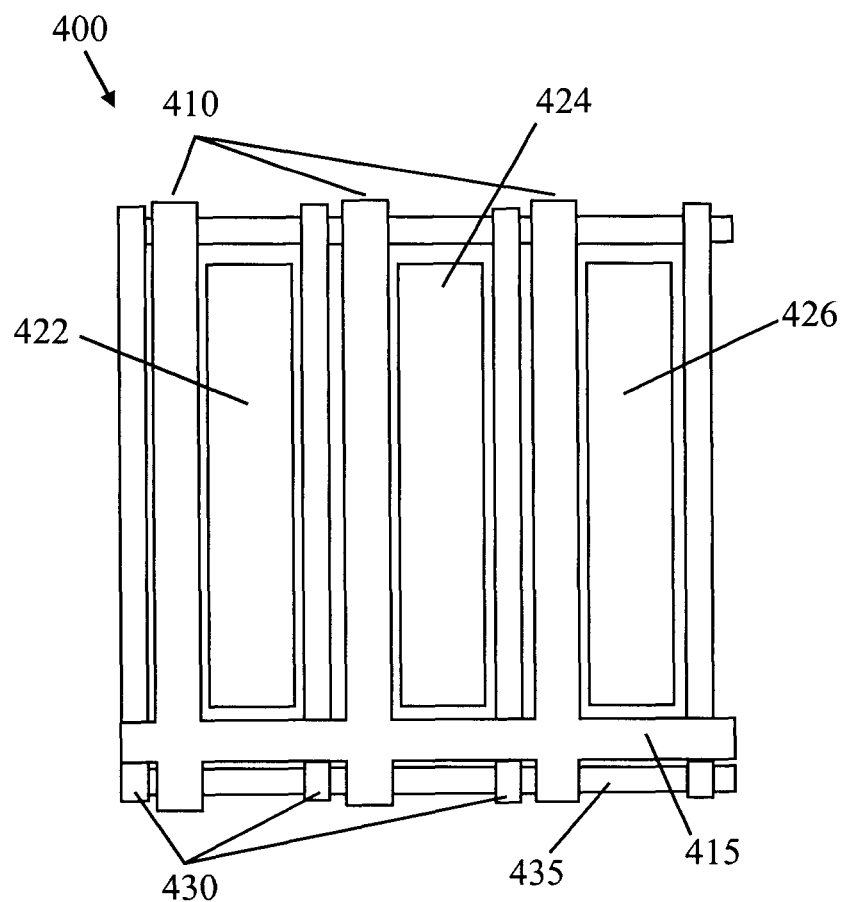
FIG. 6 is a schematic block diagram of an up-converter resonant cavity light emitting diode pixel showing the configuration of the electrodes, isolation columns and resonant cavity light emitting diodes for red, green and blue.

Since each pixel 300 has separate red 322, green 324, and blue 326 color elements, the array 200 actually has N rows and 3M columns of electrodes. FIG. 6 shows an example of active matrix addressing accomplished by applying an appropriate gate voltage to row n while all other rows are maintained off. This example is described using 975 nm resonant cavity light emitting diodes (RCLEDs) although those skilled in the art will understand that alternative semiconductor light sources may be substituted. Because the 975 nm RCLEDs have abrupt turn-on voltages of approximately 1.2 V, they are switched using a gate voltage of approximately −0.8 V applied to the row electrode 415 contacting the n-side of the RCLEDs, while the data voltage applied to each column electrode 410 contacting the p-side RCLEDs that sets the intensity to that pixel color may range from approximately 0 to approximately 1 V. The specific data voltage applied to a column electrode 410 along with the electrical resistance of the RCLED then establishes that pixel element's intensity.

The approximately 1 ms fluorescence lifetime of the up-converters establishes that the refresh rate is as high as 1 kHz. Because the RCLED modulation bandwidth can exceed 100 MHz, the semiconductor microdisplay chip uses very high speed active matrix addressing. The large RCLED bandwidth gives the possibility of active matrix addressing a microdisplay chip with greater than 105 rows of pixels, with a display refresh rate of approximately 100 Hz. The parallel addressing of the data voltages eliminates the limit on the number of columns of pixels in the microdisplay chip for the same matrixing speed. Because of the RCLED's high speed, active matrix addressing becomes feasible even for total pixel counts that could exceed $10^{10}$, with practical limits set by other considerations.

FIG. 6 is a schematic illustration of a top-down view of the layout of the 20×20 μm RGB pixel 400 showing the row 415 and column 410 electrodes, row 435 and column 430 isolations, and RCLED up-converters 422, 424 and 426. Emitter dimensions are set by the active area of the RCLED to approximately 3×15 μm and are selected for standard semiconductor etching, well-established lift-off techniques, and thin film processing. The thin film up-converters 422, 424 and 426 cover an area slightly greater than the RCLED emission region. Transparent electrical contacts are used on the p-side of the RCLEDs, while the rows of RCLEDs have a common n-side connection to be electrically contacted by horizontal gold (Au) electrodes.

The RCLED fabrication is based on thin film processing that includes low aspect selective etching, so that the row and column isolation trenches 435 and 430 are in fact quite shallow and can be micron or even sub-micron wide. The 20×20 μm pixel design shown in FIG. 6 is based on Au metallization of 1.5 μm widths. Electrical isolation of the individual RCLEDs is achieved both by the horizontal (row) trenches 435 that separate the rows of pixels on the n-side of the RCLED and vertical (column) trenches 430 that finalize the isolation on the p-side. A thin film insulator separates the n-side and p-side electrodes. Because the RCLED is designed as a thin film device, in a preferred embodiment the semiconductor surface prior to deposition of the visible light mirror and up-converting materials is planar to within approximately 0.3 μm. This nearly planar surface is important in achieving small pixel sizes. When reduced to a 5×5 μm pixel, the lithography can be maintained approximately greater than or equal to 0.5 μm to achieve high yield based on standard III-V fabrication techniques. For a 1000 row display and 100 Hz refresh rate, the pixel modulation speed only reaches approximately 100 kHz.

For the smallest size, the semiconductor light source can comprise of one or more quantum dots that can be tens of nanometers in their largest dimensions. For very small semiconductor sources microcavities can be used to efficiently transfer the light emitted from the semiconductor to the up converting materials. These microcavities can confine light of either the semiconductor or the up converting particles to the dimensions of the wavelength of the light in the material. Moreover, plasmonic confinement due to a complex refractive index material can be incorporated to confine light of either the semiconductor or up converting materials to dimensions less than the light's wavelength in bulk materials. In making such very small devices microcavity techniques will play an important role. If microcavities are used, shorter fluorescent lifetimes and higher efficiencies can be expected. The shorter fluorescent lifetime and higher efficiency are due to the optical feedback provided by the cavity, with this optical feedback modifying the radiation resistance of the fluorescing materials local environment.

The present invention provides battery powered electronic devices with indicators or displays composed of up converters in combination with semiconductor light sources. The indicator or displays may further include spatial light modulators as previously described. There can be a single or several semiconductor light sources exciting the up converters. There can be an array of semiconductor light sources exciting the up converters. The battery may contain lithium, nickel-cadmium, organic materials, or other materials used to provide electrical power to the display or indicator system. The range of battery voltage may be greater than approximately 4 volts, or less than or equal to approximately 4, approximately 3.7, or approximately 1.5 volts and thus includes batteries employing lithium, nickel-cadmium, or other materials such as organic materials suitable for low voltage generation. In addition, the electrical power may be supplied by another low voltage source such as a solar cell.

The present invention greatly improves the efficiency of such electronic devices bringing down their cost and extending the use time of the batteries between recharging. The current invention may also lead to longer battery life as it enables devices that require fewer recharging cycles over the device's life and a consequence batteries last longer overall. The present invention also advances the efficiency of low voltage electronic devices that may be battery powered and that employ information displays by greatly simplifying the design and electronic circuitry and providing displays that operate at voltages compatible with battery voltages. Another advantage is reducing the cost of electronic devices by employing GaAs based semiconductor light sources rather than nitride sources and offers superior reliability and lifetime to either nitride of organic light emitting diodes (OLEDs).

Semiconductor chip technology provides an important cost advantage by reducing the chip size since chip cost becomes strongly dependent on the number of chips a wafer can produce. Here the approximately 975 nm GaAs-based RCLED plays a pivotal role. The current density capability of the approximately 975 nm RCLED can be much higher than that of organic light emitting diodes (OLEDs), for example, to deliver higher brightness from the same chip size. The cost can be much less than nitride light emitting diodes (LEDs) due to the larger GaAs substrate size and more advanced material status that can produce higher yields. To be low cost the display chip must have high yield, requiring both high uniformity and high reliability.

Important properties of the up-conversion materials, including the efficiency temperature dependence and the critical role of scattering of the pump light in powder-binder combination are required as described in co-pending U.S. application Ser. No. 12/124,234. When these properties are accounted for, approximately 1% Er, 18% Yb:YF3 are found to be an efficient red light emitter with photometric efficiency of approximately 5 lm/W, approximately 1% Er, 18% Yb:NaYF4 produces green light with photometric efficiency of approximately 52 lm/W and approximately 0.4% Tm, 20% Yb:KY3F10 emits blue light with photometric efficiency of approximately 4.2 lm/W. These particular materials are not only the most efficient found so far, their efficient excitation by the same type of light sources at approximately 975 nm enables dense integration for high-resolution display chips. In addition, the color gamut is significantly larger than that used in conventional television displays since the red, green and blue colors are highly saturated and quite pure as shown in FIG. 3. The emission lifetimes of the emitters are all approximately 1 msec. Since their efficiencies nearly peak at eight relatively low approximately 975 nm intensities, they are in fact ideally matched to the intensity levels achieved in approximately 975 nm RCLEDs.

In a preferred embodiment, the methods and systems provide low voltage display or indicator system having a plurality of pixels. Each pixel includes at least one up converter, at least one semiconductor light source coupled with the at least one up converter for emitting a light to excite the up converter to emit an up converted emission, at least one modulator for modulating the up converted emission and a structure for selectively controlling the emission from the at least one up converter for each pixel.

In an embodiment, the at least one up converter for each pixel includes an up converter having conversion material for red light emission, an up converter having conversion material for green light emission and an up converter having conversion material for blue light emission. The semiconductor light source can include an array of semiconductor light sources for exciting the up converters or can include a semiconductor light source for exciting the red, green and blue up converter to emit the red, green and blue emissions for each pixel. The semiconductor light source can be a GaAs based semiconductor light source.

The spatial light modulator can be located behind the semiconductor light source to modulate the semiconductor light source emission that excites the up converter or be located to receive and modulate the emission from the up converter. The spatial light modulator can be a liquid crystal display, a micro electro mechanical system or other spatial light modulator that are know to those skilled in the art.

The display or indicator system can include a battery for supplying a voltage to the display or indicator system and the battery can supply a voltage great than 4 volts or a voltage within a range of approximately 4 volts to approximately 1.5 volts. The battery is a lithium ion battery or a nickel-cadmium battery.

The combination of up converters with GaAs based semiconductor light sources provide simpler, more efficient battery operated electronic devices including but not limited to cellular telephone displays, PDA displays, electronic camera and video camera displays, lap top computer and flat panel displays.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A low voltage display or indicator system consisting essentially of:
    a plurality of independently controllable pixels, each pixel consisting of:
        red, green and blue up-converters each having a corresponding up conversion material containing a Yb Co-dopant to generate red, green or blue light when excited;
        three independent semiconductor light sources respectively and directly coupled with the red, green and blue up-converters;
    the three semiconductor light sources emitting an approximately 975 nm wavelength light to respectively and directly excite the Yb co-dopant in the up conversion material in the respectively red, green and blue up-converters to emit a corresponding up-converted red, green and blue emission; and
    at least one spatial light modulator for modulating one of the semiconductor light source emission and the up converted emission;
    an addressing structure for selectively controlling and addressing the semiconductor light sources in the plurality of independently controllable pixels to excite emission from the red, green and blue up-converters for each pixel to generate red, green, blue, or combination thereof; and
    a power source connected with the semiconductor light sources in the plurality of independently controllable pixels for powering the low voltage display or indicator system.

2. The display or indicator system of claim 1 wherein each one of the three semiconductor light sources comprise:
    an array of semiconductor light sources emitting the light having an approximately 975 nm wavelength to excite the red, green and blue up-converters.

3. The display or indicator system of claim 1, further comprising:
    a spatial light modulator is located behind the three semiconductor light sources to modulate the semiconductor light source emission that excites the red, green and blue u up-converters.

4. The display or indicator system of claim 1, further comprising:
    a spatial light modulator is located to receive and modulate the emission from the red, green and blue up-converters.

5. The display or indicator system of claim 1, wherein the three semiconductor light sources comprise:
    an array of semiconductor light sources to excite the red, green and blue up-converters.

6. The display or indicator system of claim 1 wherein the three semiconductor light sources comprise:
    three GaAs based semiconductor light source.

7. The display or indicator system of claim 1 wherein the power source comprises:
    a battery for supplying a voltage to the display or indicator system.

8. The display or indicator system of claim 7 wherein the battery supplies a voltage within a range of approximately 4 volts to approximately 1.5 volts.

9. The display or indicator system of claim 7 wherein the battery is a lithium battery.

10. The display or indicator system of claim 7 wherein the battery is a nickel-cadmium battery.

11. A system for displaying color images from a display medium consisting essentially of:
- three independent semiconductor light emitting devices for each pixel of the display medium for emitting an excitation light at approximately 975 nm wavelength;
- red, green and blue up-converters each containing a corresponding red, green, or blue up converting material that includes a Yb co-dopant in a path of the light emitted by the three independent semiconductor light emitting device, the up converting material absorbing the approximately 975 nm wavelength emitted light to excite the Yb co-dopant in the up conversion material to emit an up converted red, green, blue, or combination thereof, light emission in response; and
- an addressing structure for selectively and independently addressing each independent semiconductor light emitting device to excite emission from the red, green and blue up conversion material for each pixel.

12. The system of claim 11 further comprising a spatial light modulator is selected from a group consisting of a liquid crystal display and a micro electro mechanical system (MEMS).

13. The device of claim 11, wherein the display device is powered by a battery to provide electrical power.

14. The device of claim 13, wherein the battery contains lithium, nickel-cadmium, organic materials or other materials used to provide electrical power.

15. The device of claim 14, wherein a range of the battery voltage is greater than approximately 4 volts.

16. The device of claim 14, wherein a range of the battery voltage is less than or equal to approximately 4, approximately 3.7 or approximately 1.5 volts.

17. The device of claim 11, wherein the power source is a solar cell.

18. A method of displaying color images from a display medium, each pixel of the display medium consisting essentially of the steps of:
- independently addressing three independent light sources for each pixel of the display medium;
- generating three light beam including an approximately 975 nm wavelength emission each from one of the three independent semiconductor light sources for each pixel of the display medium;
- absorbing the approximately 975 nm emission from one of the three light beam in respective red, green and blue up-converters respectively coupled with the three semiconductor light sources to excite the up conversion material that includes a Yb co-dopant to emit a red, green or blue emission; respectively and
- emitting a visible red, green, blue, white or combination thereof light from the red green and blue up-converters.

19. The method of claim 18, wherein the absorbing step comprises the steps of:
- absorbing the 975 nm wavelength emission of the first light beam at the one single wavelength in the red up converter to excite the Yb co-dopant in the red up conversion material to emit the visible red light;
- absorbing the emission of the first light beam at the same one single wavelength in the green up converter to excite the Yb co-dopant in the green up conversion material to emit the visible green light;
- absorbing the emission of the first light beam at the same one single wavelength in the blue up converter to excite the Yb co-dopant in the blue up conversion material to emit the visible blue light; and
- selectively controlling the emission from the red, green and blue up conversion material for each pixel of a display or indicator via an addressing structure for independently addressing three independent light sources for each pixel of the display medium.

20. The method of claim 18 further comprising the step of:
- modulating one of the semiconductor light source output and the visible light emission from the up converter with a spatial light modulator.

21. The method of claim 20 wherein the modulating step comprises the step of:
- placing the spatial light modulator to directly modulate an output of the semiconductor light source to modulate the visible emission from the up converter.

22. The method of claim 20 wherein the modulating step comprises the step of:
- placing the spatial light modulator to directly modulate the visible light emission from the up converter.

23. The method of claim 20 wherein the modulating step comprises the step of:
- modulating the visible emission from the up converter with a liquid crystal display.

24. The method of claim 20 wherein the modulating step comprises the step of:
- modulating the visible emission from the up converter with a micro electro mechanical system.

\* \* \* \* \*